United States Patent

Ishii et al.

Patent Number: 6,008,904
Date of Patent: Dec. 28, 1999

[54] APPARATUS AND METHODS FOR DETECTING AND CORRECTING DISTORTION OF INTERFERENCE FRINGES

[75] Inventors: Mikihiko Ishii, Saitama-ken; Takashi Gemma, Tokyo; Katsuya Miyoshi, Niiza, all of Japan

[73] Assignee: Nikon Corporation, Tokyo, Japan

[21] Appl. No.: 08/932,232

[22] Filed: Sep. 17, 1997

[30] Foreign Application Priority Data

Sep. 20, 1996 [JP] Japan .................................... 8-271447

[51] Int. Cl.$^6$ ........................................ G01B 9/02
[52] U.S. Cl. .......................................... 356/360; 356/359
[58] Field of Search .................................. 356/359, 360, 356/357

[56] References Cited

U.S. PATENT DOCUMENTS

| | | | |
|---|---|---|---|
| 4,917,498 | 4/1990 | Geary | 356/360 |
| 5,033,855 | 7/1991 | Matsui | 356/360 |
| 5,561,525 | 10/1996 | Toyonaga et al. | 356/360 |

FOREIGN PATENT DOCUMENTS

| | | |
|---|---|---|
| 62-127601 | 6/1987 | Japan . |
| 4-48201 | 2/1992 | Japan . |
| 7-167630 | 7/1995 | Japan . |

*Primary Examiner*—Samuel A. Turner
*Attorney, Agent, or Firm*—Klarquist Sparkman Campbell Leigh & Whinston, LLP

[57] ABSTRACT

Wavefront aberration-measuring apparatus are disclosed that can easily and accurately correct interference-fringe distortions arising from aberrations of an optical system in an interferometer and that can reduce wavefront aberration-measurement errors arising from such distortion. The apparatus comprise an interferometer that forms an interference fringe from a synthesis of a wavefront of light reflecting from a reference surface and a wavefront of light from a test object (such as a reflective surface or lens). The apparatus also comprises an image-pickup element for detecting the interference fringe, and an arithmetical calculator that calculates the wavefront aberration between the test object and the reference surface based on an output from the image-pickup element. Between the test object and the image-pickup element is an optical system (e.g., converging lens) that transmits a wavefront that is perpendicularly incident to a surface of the test object. An interference-fringe distortion corrector corrects the interference-fringe distortion based on a distortion aberration calculated in advance.

8 Claims, 2 Drawing Sheets

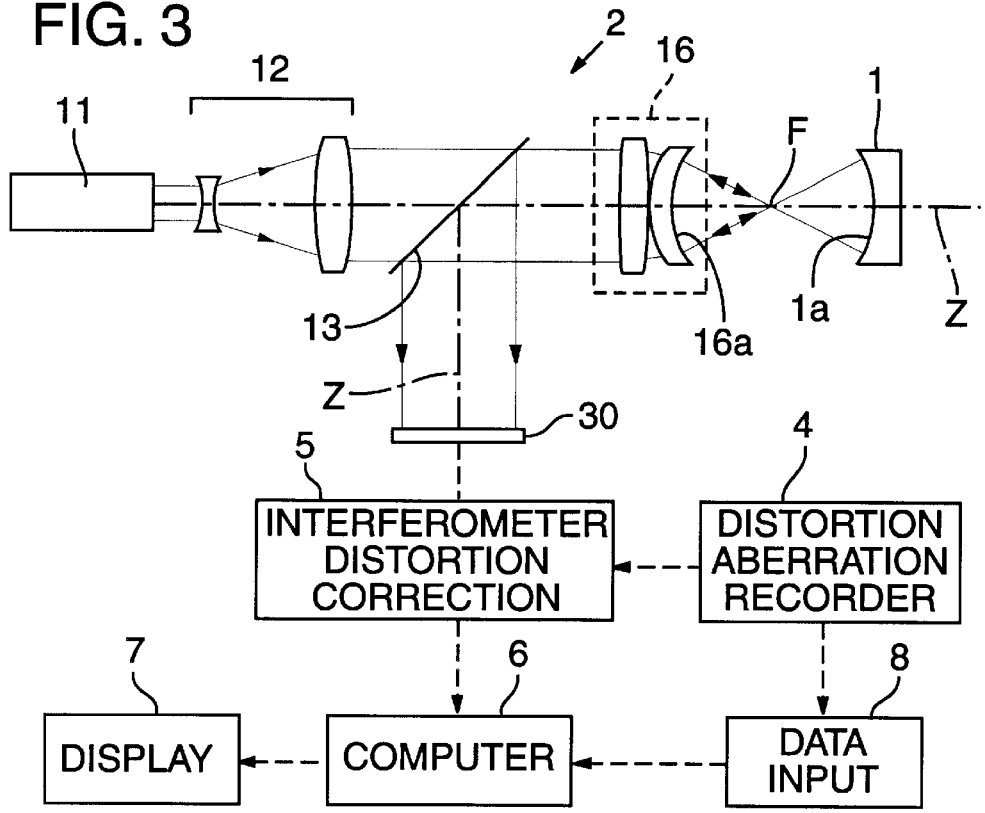
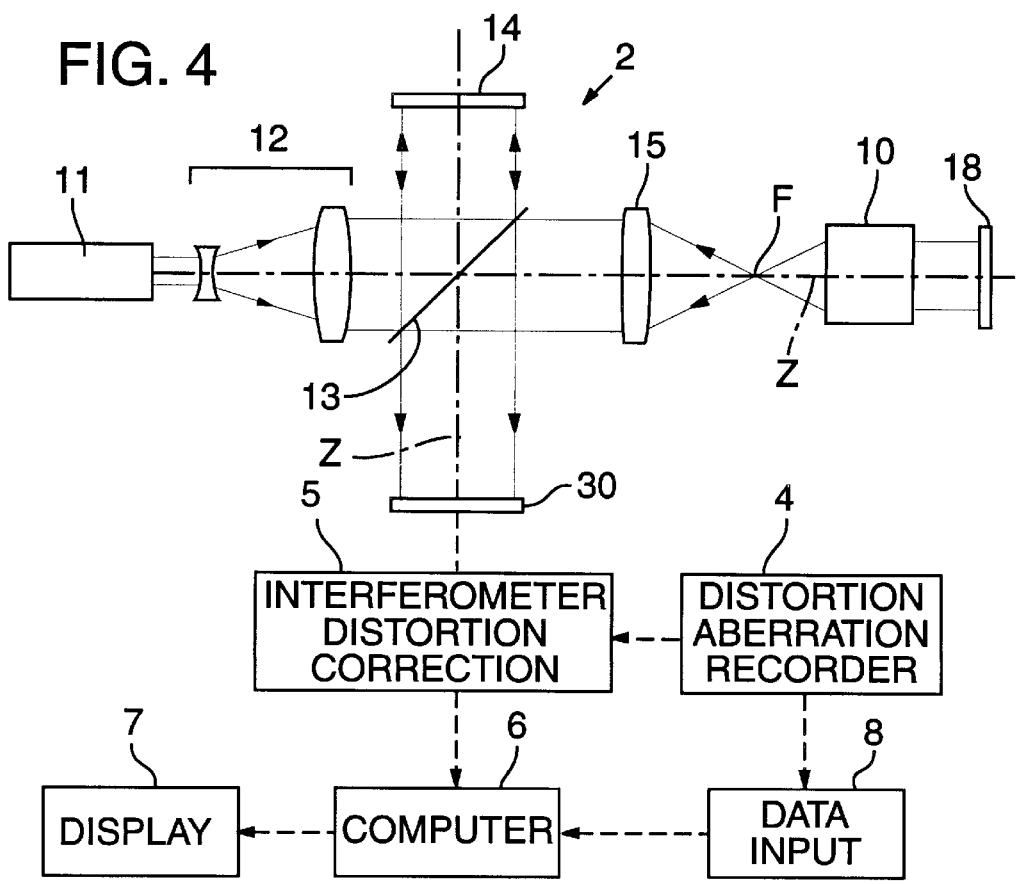

APPARATUS AND METHODS FOR DETECTING AND CORRECTING DISTORTION OF INTERFERENCE FRINGES

FIELD OF THE INVENTION

This invention pertains to apparatus for measuring wavefront aberrations, especially such apparatus that utilize optical interference to measure the wavefront aberration of a measured object.

BACKGROUND OF THE INVENTION

Apparatus for measuring wavefront aberrations, especially wavefront aberrations of lenses or the surface precision of spherical surfaces using interference fringes have been known for some time. Such apparatus are indispensable in the examination of high-precision lenses.

Many different types of schemes have been proposed for improving the measuring precision of such apparatus when measuring wavefront aberrations from the geometric strength of the interference fringes. Examples of such proposals are disclosed in Japanese laid-open patent documents Sho 62-127601 and Hei 7-16730.

With the aforementioned conventional technologies, it is assumed that aberrations in the optical system within the interferometer (specifically, interference-fringe distortions arising from any aberrations of a converging lens or lens system located between the measured object and an image pick-up element) is negligible. Such an assumption leads to problems of a loss of measuring precision when measuring spherical surfaces.

For example, the Japanese laid-open patent document Sho 62-127601 cited above discloses methods for removing measurement errors whenever the curvature enters of the reference surface and the measured surface become defocused (due to shifts in the direction of the optical axis); however, the converging lens in the interferometer is assumed to satisfy the sine condition. I.e., it is assumed that the optical system does not impart any interference-fringe distortion. Hence, with the conventional technologies, whether or not interference-fringe distortion can be corrected has had a significant effect on measurement precision.

With the conventional technology summarized above, there are problems in providing a converging lens that satisfies the sine condition. This problem is especially acute when using a Fizeau-type interferometer where, because the last lens surface of the Fizeau assembly is used as a reference surface ("Fizeau surface"), there are more optical design restrictions and the amount of interference-fringe distortion arising from converging-lens aberration increases. Such distortion is extremely difficult to correct.

SUMMARY OF THE INVENTION

In view of the foregoing, an object of the present invention is to provide apparatus and methods for correcting, simply and precisely, any distortion of the interference fringe arising from aberrations of the optical system of the interferometer. Another object is to provide wavefront aberration measuring apparatus and methods that can reduce wavefront aberration-measurement errors arising from such distortion.

According to one aspect of the invention, the foregoing objects are satisfied by a wavefront aberration-measuring apparatus that comprises an interferometer, an interference-fringe detector, an optical system, an interferometer-distortion corrector, and an arithmetical calculator. The interferometer forms an interference fringe from light having a wavefront originating from a reference surface with light having a wavefront originating from a test object. The interference-fringe detector detects the interference fringe. The optical system is situated between the interference-fringe detector and the test object. The optical system emits a light wavefront that is perpendicularly incident on the test surface. The interferometer-distortion corrector is connected to the interference-fringe detector and corrects the detected interference fringe for a predetermined distortion aberration of the optical system so as to produce a corrected interference fringe. The arithmetical calculator is connected to the interferometer-distortion corrector and computes a wavefront aberration between the test object and the reference surface based on the corrected interference fringe. The interference-distortion corrector preferably uses a power-series calculation to determine the corrected interference fringe. Alternatively, the interference-distortion corrector can use, for example, a Fourier-series calculation to determine the corrected interference fringe.

In preferred embodiments, the interferometer is either a Twyman-Green interferometer, in which the optical system comprises a converging lens, or a Fizeau interferometer in which the optical system comprises a Fizeau lens.

Further preferably, the apparatus comprises a display and data-input device such as a keyboard. The display and data-input device are connected to the arithmetical calculator.

Further preferably, the apparatus comprises a distortion-aberration recorder connected to the interferometer distortion corrector. The distortion-aberration recorder is operable for storing data concerning distortion aberrations imparted by the optical system.

The apparatus can also include a laser light source that is situated so as to direct a light beam into the interferometer.

Ad According to another aspect of the invention, methods are provided for determining wavefront aberrations of a test object. In a first step, a light beam is split to produce first and second portions of the light beam. In a second step, the first portion of the light beam is directed toward a reference surface; the second portion of the light beam is directed through an optical system toward a test object. In a third step, light is received from the first portion of the light beam, returning from the reference surface and light, from the second portion of the light beam, returning from the test object to produce an interference fringe. The interference fringe is detected. A corrected interference fringe is determined by subtracting any effect contributed to the detected interference fringe by wavefront aberrations imparted by passage of the second portion of the light beam through the optical system. The subtracted effect is predetermined based on data concerning an optical characteristic of the optical system.

The optical system has a focal point, and the test object is preferably positioned relative to the focal point such that light waves diverging from the focal point are incident perpendicularly on a surface of the test object. The effect contributed to the detected interference fringe by wavefront aberrations imparted by passage of the second portion of the light beam through the optical system is determined by simulating an aberration imparted to ray traces through the optical system. The calculation can be, for example, a power series or a Fourier series.

The foregoing and additional features and advantages of the invention will be more readily apparent from the following detailed description which proceeds with reference to the accompanying drawings.

BRIEF DESCRIPTION OF THE DRAWINGS

FIG. 3 is an optical diagram of a wavefront aberration-measuring apparatus according to a second embodiment of the invention.

FIG. 4 is an optical diagram of a wavefront aberration-measuring apparatus according to a third embodiment of the invention.

DETAILED DESCRIPTION OF PREFERRED EMBODIMENTS

Wavefront aberration-measuring apparatus according to the present invention can be used to perform measurements such as the precision of an optical flat, the precision of a spherical surface of an optical element, or the precision of a wavefront aberration in any of various lenses using an interference fringe. Various representative embodiments are discussed below which represent the current best mode.

First Embodiment

Figure 1:
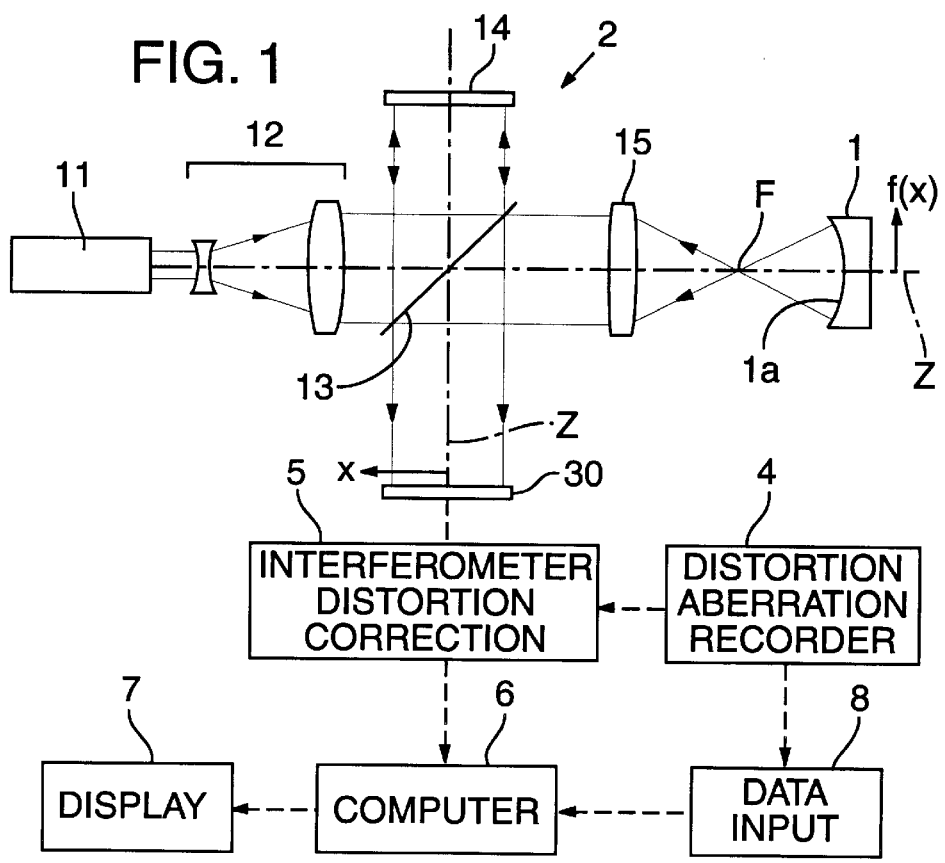
FIG. 1 is an optical diagram of a wavefront aberration-measuring apparatus according to a first embodiment of the invention.

FIG. 1 is an optical diagram of a wavefront aberration-measuring apparatus 2 according to a first embodiment of this invention. This embodiment can perform a measurement of the surface precision of a test surface (e.g., a spherical reflecting surface) 1a of a test object 1. The precision of the surface 1a is measured as a wavefront aberration.

The apparatus 2 comprises a He—Ne or other laser light source 11, a beam expander 12, a beamsplitter 13, a reference surface 14 (e.g., a reflecting surface of a reference mirror), a converging lens 15, and an image-pickup element 30. The general configuration is that of a Twyman-Green interferometer.

The laser light source 11 emits a light flux that, upon passing through the beam expander 12, acquires a desired flux diameter. The light flux enters the beamsplitter 13 which reflects a portion of the light flux toward the reference surface 14. Light reflected from the reference surface (i.e., "reference light") is transmitted through the beamsplitter 13 to the image-pickup element 30. The portion of the light flux from the laser light source 11 that is transmitted through the beamsplitter 13 is focused by the converging lens 15 to a point F from which the light diverges. The divergent light is reflected by the test surface 1a (thus becoming "measurement light") of the test object and returns to the beamsplitter 13. The measurement light is reflected by the beamsplitter 13 toward the image-pickup element 30 to interfere with the reference light and form an interference fringe.

As discussed above, the converging lens 15 causes light passing therethrough from the beamsplitter 13 to converge at the convergence point F. In other words, the convergence point F is the focal point of the converging lens 15. The test object 1 is positioned relative to the convergence point F such that waves diverging from the convergence point F are incident perpendicularly on the test surface 1a. In other words, the test object 1 is positioned such that the center of curvature of the test surface 1a is at the convergence point F.

When adjusting the position of the test object 1, any error arising as a result of an axial shift of the center of curvature of the test surface 1a from the convergence point F is removed using a method as described in the Japanese laid-open patent document Sho 62-127601 cited above.

Thus, the image-pickup element 30 receives interference fringes that result from interference of the wavefront of light reflected from the reference mirror 14 with the wavefront of light reflected from the test surface 1a. The interference fringe is detected by the image-pickup element 30 which generates an electrical output signal corresponding to the interference fringe.

The apparatus 2 also preferably comprises: (1) a "distortion-aberration recorder" (i.e., distortion-level storage system 4 such as a memory or analogous data storage means) for storing a previously determined distortion level of the converging lens 15; (2) an interferometer-distortion-correction circuit 5 that "corrects" the interference fringe detected by the image-pickup element 30 by subtracting the effect on the interference fringe of the distortion-level data stored in the storage system 4; (3) a computer or other arithmetical processor 6 that calculates, from the corrected interference fringe, any wavefront aberrations occurring between the test surface 1a and the reference surface 14; (4) a display 7 (e.g., CRT) for displaying the calculated wavefront aberrations; and (5) an input device 8 (e.g., keyboard) for entering data concerning, e.g., the converging lens 15.

Since the converging lens 15 typically exhibits distortion, the displacement of an interference fringe relative to the optical axis Z, as detected by the image-pickup element 30, and the displacement of a particular location on the image surface 1a from the optical axis Z do not have one-to-one correspondence in a linear manner. The present invention provides a way to "correct" such displacement of the interference fringe, as follows.

First, with the test surface 1a as an "object surface" and the image-pickup device 30 providing an "image surface", distortion of the converging lens 15 is calculated by simulating an aberration of the ray traces through that lens. Distortion of the converging lens 15 can also be determined by regarding the image-pickup element 30 as the object surface and the test surface 1a as the image surface and simulating the aberration.

The distortion of the converging lens 15 is calculated according to the following:

$$f(x) = C_1 x + C_3 x^3 + C_5 x^5 + C_7 x \qquad (1)$$

wherein x is the displacement, relative to the optical axis Z, of an interference-fringe point on the image-pickup element 30 and f(x) is the lateral position of the corresponding point on the test surface 1a.

In equation (1), the coefficients $C_1$, $C_3$, $C_5$, and $C_7$ are determined for each converging lens 15 by simulating aberrations exhibited in ray traces. These coefficients $C_1$, $C_3$, $C_5$, and $C_7$ are recorded in the storage system 4 as distortion levels.

The range of aberration simulation is determined by the curvature radius R of the test surface 1a and the numerical aperture, as input using the input device 8. The simulated values of the distortion and numerical aperture of the light flux, when calculating the wave-form aberration and the curvature R of the test surface 1a, are input into the storage system 4 using the input device 8 (i.e., as numerical values determining the range of the light flux irradiated onto the test surface 1a by the apparatus 2).

Thus, the interference-fringe signals produced by the image-pickup element 30 are corrected by the correction circuit 5 using equation (1). The coefficients $C_1$, $C_3$, $C_5$, and $C_7$ are stored in the storage system 4. The numerical aperture and the curvature radius R of the test surface 1a, input using the input device 8, are used in this correction.

The distortion of the interference fringe is corrected using software employing the fitting coefficients $C_1$, $C_3$, $C_5$, and $C_7$ (which are fitted with a power-series formula on the distortion of the converging lens 15 in the first embodiment). For this reason, distortion of the interference fringe resulting from aberrations of the converging lens 15 can be corrected simply and with a high degree of precision. As a result, the perceived distortion of the interference fringe can be corrected and the measurement error of the wavefront aberration caused by interference-fringe distortion can be reduced. This results in improved surface-measuring precision.

Figure 2:
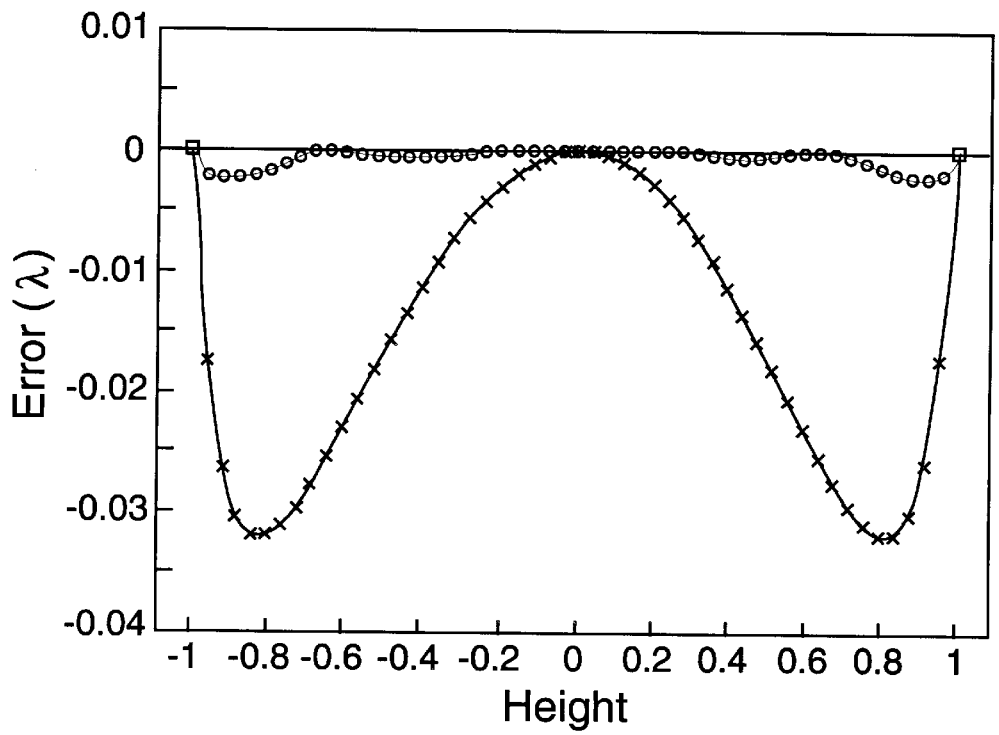
FIG. 2 is a plot comparing the measuring performance of a wavefront aberration-measuring apparatus according to the first embodiment with a conventional apparatus.

FIG. 2 illustrates a comparison of the measurement performance of conventional technology with the measurement performance of the wavefront aberration-measuring apparatus of the first embodiment. In FIG. 2, the abscissa represents from a base-point coordinate (e.g., the optical axis Z) for each point on the test surface 1a, and the ordinate represents the measurement error perpendicular to the test surface 1a.

The radius of the test surface 1a is normalized to unity for the height on the test surface 1a. The measurement error is shown in units of the wavelength of light λ. The curve connecting the "x" symbols depicts results of measurements made after removing any measurement error occurring due to a shift in the center of curvature of the test surface 1a shifts from the convergence point F toward the optical axis (as described in the Japanese 62-127601 patent document). In contrast, the curve connecting the "o" symbols depicts the results of measurements made after correcting, according to the first embodiment, the interference-fringe distortion.

As is clear from FIG. 2, measurement errors have been greatly reduced by correcting the distortion in the interference fringe using the first embodiment.

Further with respect to the first embodiment, the coefficients $C_1$, $C_3$, $C_5$, and $C_7$ are stored directly in the storage system 4 as distortion values (distortion-aberration simulation values). However, distortion-aberration simulation values can be calculated at any time because data concerning the converging lens 15, which constitutes the basis for the simulation, can be stored. Actual measured values of the distortion aberration can be substituted for the simulation value and used in the power series formula on the actual measured values.

In the first embodiment, as seen in equation (1), an odd-numbered sequence is used because the distortion aberration (according to aberration theory) can be expressed only with odd numbers. However, if the relationship between f(x) and x is expressed precisely, then even-numbered subscripts could also be used.

In equation (1), the highest number in the sequence need not be 7. The relational expression itself is not limited to the power series noted in equation (1). Fitting can also be performed using a Fourier series formula as follows:

$$f(x) = \sum_n C_n \sin \frac{2n\pi x}{T} \quad (2)$$

The numerical aperture value input using the input device 8 can be obtained by measuring the actual diameter of the light flux irradiated onto the test surface 1a.

The first embodiment can be used to test a planar reflective test surface instead of the spherical test surface 1a. When measuring a planar reflective test surface, an optical system that emits a parallel light flux can be used (in the manner of a beam expander) instead of the converging lens 15. Either type of optical system emits a wavefront that enters the test surface perpendicularly to correct the interference-fringe distortion based on the distortion aberration of the optical system.

Second Embodiment

The second embodiment of this invention is shown in FIG. 3. Whereas the first embodiment is configured as a Twyman-Green interferometer, the second embodiment is configured as a Fizeau interferometer. Otherwise, the second embodiment is similar to the first embodiment.

Referring to FIG. 3, a Fizeau lens 16 is used to convert a plane wave to a spherical wave. The Fizeau lens 16 comprises, as its final lens surface, a spherical Fizeau surface 16a serving as a reference surface. The focal (convergence) point F for the Fizeau lens 16 is the spherical center point of the spherical Fizeau surface 16a. The test object 1 is placed so that the center point of the spherical surface 1a coincides with the focal (convergence) point F. As a result, an interference fringe resulting from interference between the wavefront reflected light at the reference surface 16a (reference light) and the wavefront of reflected light at the test surface 1a (measured light) is formed on the image-pickup element 30.

The second embodiment also preferably comprises: (1) a distortion-level storage system 4 (e.g., memory or analogous data storage means) for storing a previously determined distortion level of the reference surface 16a; (2) an interferometer-distortion-correction circuit 5 that "corrects" the interference fringe detected by the image-pickup element 30 by subtracting the effect on the interference fringe of the distortion-level data stored in the storage system 4; (3) a computer or other arithmetical processor 6 that calculates, from the corrected interference fringe, any wavefront aberrations occurring between the test surface 1a and the reference surface 16a; (4) a display 7 for displaying the calculated wavefront aberrations; and (5) an input device 8 (e.g., keyboard) for entering data concerning, e.g., the reference surface 16a.

With a configuration as described above, the second embodiment yields a corrected wavefront aberration measurement as the first embodiment.

When using a Fizeau-type interferometer, the last surface 16a of the Fizeau lens 16 is used as a reference surface (Fizeau surface). A Fizeau-type interferometer can pose certain optical design concerns due to the often increased interference-fringe distortion arising from aberrations in its optical system. The wavefront aberration-measuring apparatus of the second embodiment is especially effective in compensating for such aberrations.

In the second embodiment, a Fizeau lens comprising a diverging optical system can be used instead of the converging Fizeau lens 16 for producing a wavefront that enters the test surface 1a perpendicularly. Correction of interference-fringe distortion can be based on the distortion aberration of the Fizeau lens.

Also, the second embodiment can be used to test a planar reflecting test surface rather than the spherical test surface 1a shown. Also, an optical system that emits a parallel light flux, such as a beam expander, can be used instead of the Fizeau lens 16 as the optical system that emits an incident wavefront perpendicular to the test surface and the interference fringe distortion based on the distortion aberration of this optical system may be corrected.

Wavefront aberration-measuring apparatus according to the first and second embodiments can measure wavefront aberrations generated by the test surface 1a (normally a spherical reflective surface). Either embodiment can also be used for measuring transmission wavefront aberrations of a test lens (e.g., a projection lens for a microlithography apparatus). An apparatus according to the first embodiment configured for measuring transmitted light is described herein as the third embodiment, below.

Third Embodiment

FIG. 4 shows a wavefront aberration-measuring device according to the third embodiment of the invention. In the third embodiment, a Twyman-Green interferometer is used as used in the first embodiment. The interferometer 2 of the third embodiment is especially configured to measure the transmission wavefront aberration of a test lens (or other transmissive test object) 10.

The test lens 10 is placed so that its focal-point position coincides with the focal (convergence) point F of the converging lens 15. A precision, planar, reflecting mirror 18 is placed behind the test lens 10. The reflecting mirror 18 reflects the parallel light flux transmitted through the test lens 10.

Light reflected from the mirror 18 returns through the test lens 10. The returning light reflects from the beamsplitter 13 and interferes with light reflected from the reference surface 14. The interference fringes are detected by the image-pickup element 30. Thus, the third embodiment functions in a manner similar to the first embodiment.

In place of the converging lens 15, a diverging optical system could be used as the optical system that emits a wavefront entering the test surface 1a perpendicularly in the first and third embodiments. Such a diverging optical system could be used to correct any interference-fringe distortion arising from distortion aberrations arising in the optical system.

With wavefront aberration-measuring apparatus according to this invention, interference-fringe distortion arising from an aberration in the optical system that directs a wavefront to impinge perpendicularly on a test surface is placed between the test object and an interference-fringe detector (i.e., image-pickup element). Detected interference-fringe distortion of the optical system is corrected by electronic processing. This allows simple and precise corrections of interference-fringe distortions. As a result, wavefront aberrations and measurement errors due to interference-fringe distortion are reduced and the measurement precision of, e.g., optical surfaces, is improved.

Whereas the invention has been described in connection with several embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A wavefront aberration-measuring apparatus, comprising:
    (a) an interferometer that forms an interference fringe from light having a wave surface originating from a reference surface with light having a wave surface originating from a test object;
    (b) an interference-fringe detector that detects the interference fringe;
    (c) an optical system, situated between the interference-fringe detector and the test object, that emits a light-wave surface that is perpendicularly incident on the test surface;
    (d) an interferometer-distortion corrector, connected to the interference-fringe detector, that corrects the detected interference fringe for a predetermined distortion of the optical system, thereby producing a corrected interference fringe wherein the interferometer-distortion corrector utilizes a power-series calculation to determine the corrected interference fringe; and
    (e) an arithmetical calculator, connected to the interferometer-distortion corrector, that computes a wavefront aberration between the test object and the reference surface based on the corrected interference fringe.

2. A wavefront aberration-measuring apparatus, comprising:
    (a) an interferometer that forms an interference fringe from light having a wave surface originating from a reference surface with light having a wave surface originating from a test object;
    (b) an interference-fringe detector that detects the interference fringe;
    (c) an optical system, situated between the interference-fringe detector and the test object, that emits a light-wave surface that is perpendicularly incident on the test surface;
    (d) an interferometer-distortion corrector, connected to the interference-fringe detector, that corrects the detected interference fringe for a predetermined distortion of the optical system, thereby producing a corrected interference fringe, wherein the interferometer-distortion corrector utilizes a Fourier-series calculation to determine the corrected interference fringe; and
    (e) an arithmetical calculator, connected to the interferometer-distortion corrector, that computes a wavefront aberration between the test object and the reference surface based on the corrected interference fringe.

3. A method for determining wavefront aberrations of a test object, the method comprising:
    (a) splitting a light beam to produce first and second portions of the light beam;
    (b) directing the first portion of the light beam toward a reference surface and the second portion of the light beam through an optical system toward a test object, wherein the optical system has a focal point, the test object being positioned relative to the focal point such that light waves diverging from the focal point are incident perpendicularly on a surface of the test object;
    (c) receiving light, from the first portion of the light beam, returning from the reference surface and light, from the second portion of the light beam, returning from the test object to produce an interference fringe;
    (d) detecting the interference fringe; and
    (e) determining a corrected interference fringe by subtracting any effect contributed to the detected interference fringe by wavefront aberrations imparted by passage of the second portion of the light beam through the optical system, the subtracted effect being predetermined based on data concerning an optical characteristic of the optical system, wherein the effect contributed to the detected interference fringe by wavefront aberrations imparted by passage of the second portion of the light beam through the optical system is determined by simulating an aberration imparted to ray traces through the optical system.

4. The method of claim 3, wherein the distortion of the optical system is calculated according to an expression:

$$f(x) = C_1 x + C_3 x^3 + C_5 x^5 + C_7 x^7.$$

5. The method of claim 3, wherein the distortion of the optical system is calculated according to a Fourier series expression:

$$f(x) = \sum_n C_n \sin\left(\frac{2\pi n x}{T}\right)$$

6. A method for determining wavefront aberrations of a test object, the method comprising:
   (a) splitting a light beam to produce first and second portions of the light beam;
   (b) directing the first portion of the light beam toward a reference surface and the second portion of the light beam through an optical system toward a test object;
   (c) receiving light, from the first portion of the light beam, returning from the reference surface and light, from the second portion of the light beam, returning from the test object to produce an interference fringe;
   (d) detecting the interference fringe;
   (e) calculating an effect contributed to the interference fringe by distortion; and
   (f) determining a corrected interference fringe by subtracting an effect contributed to the detected interference fringe by distortion imparted by passage of the second portion of the light beam through the optical system, the subtracted effect being predetermined based on data concerning an optical characteristic of the optical system.

7. A wavefront aberration-measuring apparatus, comprising:
   (a) an interferometer that forms an interference fringe from light having a wave surface originating from a reference surface with light having a wave surface originating from a test object;
   (b) an interference-fringe detector that detects the interference fringe;
   (c) an optical system, situated between the interference-fringe detector and the test object, that emits a light-wave surface that is perpendicularly incident on the test surface;
   (d) an interferometer-distortion corrector, connected to the interference-fringe detector, that corrects the detected interference fringe for a predetermined distortion of the optical system, thereby producing a corrected interference fringe; and
   (e) an arithmetical calculator, connected to the interferometer-distortion corrector, that computes a wavefront aberration between the test object and the reference surface based on the corrected interference fringe, wherein the predetermined distortion is calculated from an optical characteristic of the optical system.

8. The wavefront measuring apparatus of claim 7, wherein the predetermined distortion is calculated by ray tracing.

* * * * *

UNITED STATES PATENT AND TRADEMARK OFFICE
CERTIFICATE OF CORRECTION

PATENT NO. : 6,008,904
DATED : December 28, 1999
INVENTOR(S) : Ishii, et. al.

It is certified that error appears in the above-identified patent and that said Letters Patent is hereby corrected as shown below:

Column 1, lines 59-60, "aberration measuring" should be --aberration-measuring--.

Column 2, line 36, "Ad" should be deleted.

Column 6, line 23, --of-- should be added after "wavefront" and before "reflected".

Signed and Sealed this

Eighth Day of May, 2001

NICHOLAS P. GODICI

*Attest:*

*Attesting Officer*   Acting Director of the United States Patent and Trademark Office